United States Patent
Kim et al.

(10) Patent No.: US 7,193,539 B2
(45) Date of Patent: Mar. 20, 2007

(54) PRECODER AND OPTICAL DUO-BINARY TRANSMISSION APPARATUS USING THE SAME

(75) Inventors: Sung-Kee Kim, Suwon-si (KR); Han-Lim Lee, Seoul (KR); Yun-Je Oh, Yongin-si (KR); Seong-Taek Hwang, Pyeongtaek-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 10/807,048

(22) Filed: Mar. 23, 2004

(65) Prior Publication Data
US 2005/0068209 A1    Mar. 31, 2005

(30) Foreign Application Priority Data
Sep. 25, 2003   (KR) ............... 10-2003-0066587

(51) Int. Cl.
*H03M 5/00* (2006.01)
(52) U.S. Cl. ............... 341/58; 341/111; 341/50
(58) Field of Classification Search ............ 341/58, 341/111, 50; 370/535; 385/2; 398/140, 398/182, 189, 192, 201
See application file for complete search history.

(56) References Cited

U.S. PATENT DOCUMENTS

| | | | | |
|---|---|---|---|---|
| 3,836,904 A | * | 9/1974 | Cross | ............... 341/70 |
| 4,926,423 A | * | 5/1990 | Zukowski | ............... 370/540 |
| 5,892,858 A | * | 4/1999 | Vaziri et al. | ............... 385/2 |
| 5,917,638 A | * | 6/1999 | Franck et al. | ............... 398/201 |
| 6,522,438 B1 | * | 2/2003 | Mizuhara | ............... 398/189 |
| 6,542,276 B1 | * | 4/2003 | Laroia et al. | ............... 398/192 |
| 6,595,707 B1 | * | 7/2003 | Kuwata | ............... 398/140 |
| 6,623,188 B1 | * | 9/2003 | Dimmick et al. | ............... 398/182 |
| 6,909,386 B1 | * | 6/2005 | Kim et al. | ............... 341/111 |
| 6,934,308 B1 | * | 8/2005 | Yonenaga et al. | ............... 370/535 |

FOREIGN PATENT DOCUMENTS

| | | |
|---|---|---|
| EP | 1026863 A2 | 8/2000 |
| JP | 11-122205 | 4/1999 |
| JP | 2000-224244 | 8/2000 |

* cited by examiner

*Primary Examiner*—Jean Bruner Jeanglaude
(74) *Attorney, Agent, or Firm*—Cha & Reiter, LLC (57) ABSTRACT

A precoder for an optical duo-binary transmission apparatus disposing the precoder before a time division multiplexer includes a judgment unit for judging whether an odd number or even number of '1's exist in data input signals of N channels inputted at an $n^{th}$ time of channel input. Further included in the precoder is a toggle unit for toggling an output signal of the judgment unit when the judgment is odd, and for determining an output value for one of the channels. The precoder also has an output unit for determining output values of other channels according to a respective data input signal and a predetermined channel from among the N channels.

17 Claims, 8 Drawing Sheets

PRECODER AND OPTICAL DUO-BINARY TRANSMISSION APPARATUS USING THE SAME

CLAIM OF PRIORITY

This application claims priority to an application entitled "Precoder and Optical Duo-Binary Transmission Apparatus Using the Same," filed in the Korean Intellectual Property Office on Sep. 25, 2003 and assigned Serial No. 2003-66587, the contents of which are hereby incorporated herein by reference.

BACKGROUND OF THE INVENTION

1. Field of the Invention

The present invention relates to an optical duo-binary transmission apparatus using an optical duo-binary transmission method, and more particularly to a precoder performing parallel processing and an optical duo-binary transmission apparatus using the same.

2. Description of the Related Art

A Dense Wavelength Division Multiplexing (hereinafter "DWDM") optical transmission system has excellent communication efficiency, since it can transmit an optical signal having multiple channels with different wavelengths through a single optical fiber. Transmission speed is not a limiting factor, because an optical signal travels at the speed of light through the optical medium. Accordingly, DWDM systems are now widely used in ultra-high speed internet networks, and data traffic on such networks is increasing. Systems in common use employing DWDM technology, as of late, are each capable of transmitting more than a hundred channels through a single optical fiber. Furthermore, various research efforts are being actively conducted to develop a system which can transmit more than two hundred 40-gigabits-per-second (Gbps) channels through a single optical fiber simultaneously, for an overall transmission speed on the order of 10 terabits-per-second (Tbps).

In meeting a rapid increase of data traffic and a request for high-speed transmission of data of more than 40 Gbps, however, the enlargement of transmission capacity is restricted due to severe interference and distortion between channels if the channel distance is less than 50 GHz when a light intensity is modulated using the conventional non-return-to-zero (NRZ) method. In particular, transmission distance is restricted in high-speed transmission of more than 10 Gbps since a direct current (DC) frequency component of a conventional binary NRZ transmission signal and a high frequency component spread during modulation causes non-linearity and dispersion when the binary NRZ transmission signal propagates in an optical fiber medium.

Recently, an optical duo-binary technology has been highlighted as an optical transmission technology capable of overcoming restriction of transmission distance due to chromatic dispersion. A main advantage of the duo-binary transmission is that the transmission spectrum is reduced in comparison to the general binary transmission. In a dispersion restriction system, transmission distance varies inversely with the square of the transmission spectrum bandwidth. When the transmission spectrum is halved, for example, the transmission distance quadruples. Furthermore, since a carrier frequency is suppressed in a duo-binary transmission spectrum, it is possible to relax the restriction of an optical power output caused by Brillouin scattering excited in the optical fiber.

Figure 1:
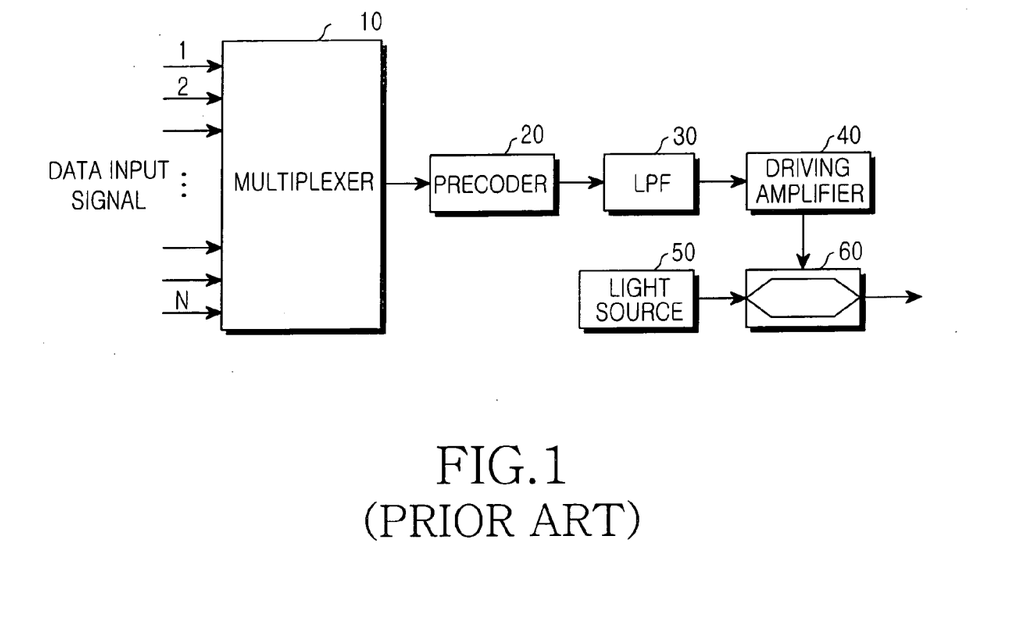
FIG. 1 is a block diagram showing a construction of a conventional optical duo-binary transmission apparatus.

FIG. 1 is a block diagram showing one construction of a conventional optical duo-binary transmission apparatus. Hereinafter, the conventional optical duo-binary transmission apparatus will be described with reference to FIG. 1.

In FIG. 1, the conventional optical duo-binary transmission apparatus includes a multiplexer 10, a precoder 20, a low pass filter 30, a modulator driving amplifier 40, a laser source 50 for outputting a carrier wave, and a Mach-Zehnder interferometer type optical intensity modulator 60. The multiplexer 10 multiplexes data input signals of N number of channels so as to output the multiplexed signal, and the precoder 20 codes the multiplexed signal. The low-pass filter 30 converts a 2-level binary signal outputted from the precoder 20 into a 3-level electrical signal, and reduces the bandwidth of the signal. The modulator driving amplifier 40 amplifies the 3-level electrical signal to output an optical modulator driving signal.

The input signals of N number of channels are multiplexed by the multiplexer 10, and the multiplexed signal is then coded by the precoder 20. The 2-level binary signal outputted from the precoder 20 is inputted to the low-pass filter 30, the low-pass filter having a bandwidth corresponding to about ¼ of a clock frequency of the 2-level binary signal. This excessive limitation to the bandwidth causes interference between codes, which thus changes the 2-level binary signal to a 3-level duo-binary signal. The 3-level duo-binary signal is amplified by the modulator driving amplifier 40 so as to be used as a driving signal of the Mach-Zehnder interferometer type optical intensity modulator 60. The carrier wave outputted from the laser source 50 is subjected to phase and optical intensity modulation according to the driving signal of the Mach-Zehnder interferometer type optical intensity modulator 60 and is then outputted as a 2-level optical duo-binary signal.

Figure 2:
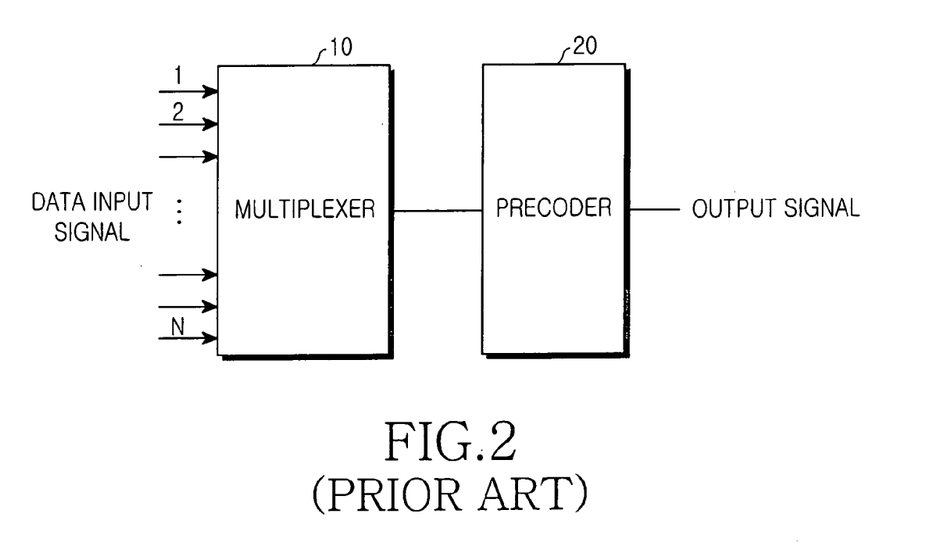
FIG. 2 is a view showing a position of a precoder in the conventional optical duo-binary transmission apparatus.

FIG. 2 shows a position of the precoder 20 in the optical duo-binary transmission apparatus. Referring to FIG. 2, the N number of input signals are time-multiplexed by the multiplexer 10, and the multiplexed signal is coded by the precoder 20. Accordingly, transmission speed increases N times in comparison with transmission speed before the multiplexing. This means that a high-speed precoder is necessary.

Figure 3:
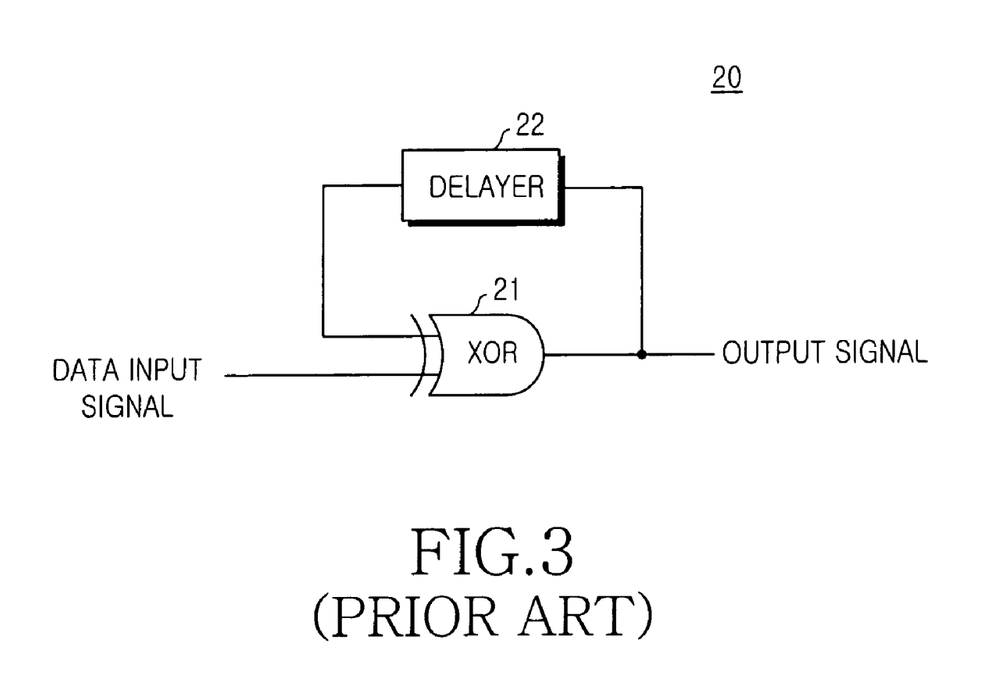
FIG. 3 is a view showing a structure of the conventional representative precoder.
Figure 4:
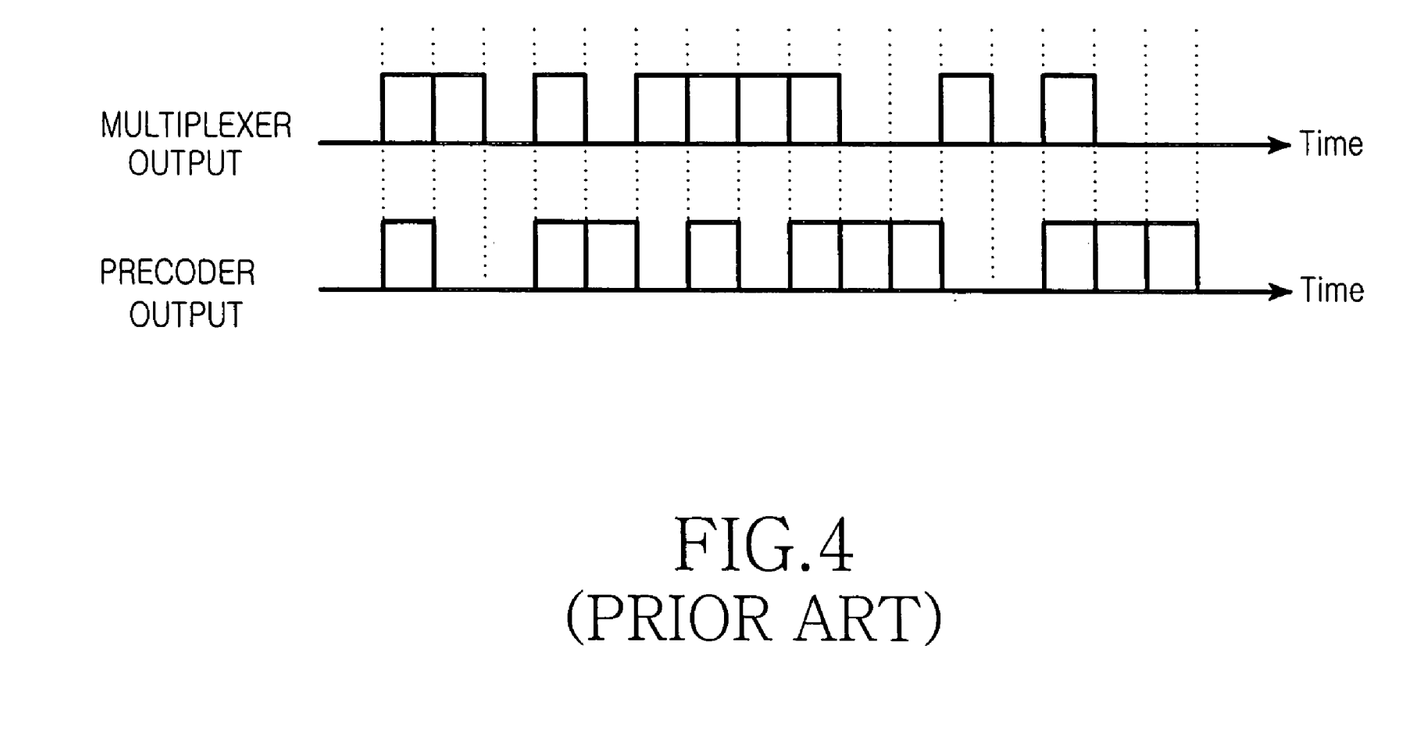
FIG. 4 is a view showing an example of input/output signals in FIG. 3.

FIG. 3 is a view showing a structure of the conventional precoder 20. The precoder 20 includes one exclusive OR (XOR) gate 21 and one data bit delayer 22. When a signal having a data sequence of 11010111101010 is inputted to the precoder 20, the precoder outputs a signal having a data sequence of 10011010111100111 as shown in FIG. 4. That is, the precoder 20 toggles the previous output signal whenever the input signal becomes 1.

However, according to the prior art, in the case of a high-speed data signal, it is difficult to realize a high-speed precoder due to time delay and limitation in speed of the XOR gate constituting the precoder.

SUMMARY OF THE INVENTION

The present invention has been made to solve the above-mentioned problems occurring in the prior art. A first object of the present invention is to provide a precoder which can achieve a high speed even with existing low-speed electrical elements by coding multiple input data in parallel before time division multiplexing. Another object is to provide an optical duo-binary transmission apparatus using the precoder.

In order to accomplish the aforementioned objects, according to one aspect of the present invention, there is provided a precoder that includes a judgment unit for judging whether an odd number or even number of '1's exists in data input signals of N channels inputted at an $n^{th}$ time of channel input. Further included in the precoder is a toggle unit for toggling an output signal of the judgment unit when the number of '1's is judged by the judgment unit to be odd. The toggling determines an output value of one of the N channels. Communicatively connected to the toggle unit is an output unit for determining output values of other channels according to respective ones of the data input signals.

In order to accomplish the aforementioned objects, according to one aspect of the present invention, there is provided an optical duo-binary transmission apparatus that includes a precoder for coding in parallel data input signals of N channels, and a multiplexer for time division multiplexing the signals coded by the precoder.

BRIEF DESCRIPTION OF THE DRAWINGS

The above and other objects, features and advantages of the present invention will be more apparent from the following detailed description taken in conjunction with the accompanying drawings, in which elements are annotated identically for the same or similar elements throughout the several views.

DETAILED DESCRIPTION OF THE PREFERRED EMBODIMENT

Preferred embodiments according to the present invention are described with reference to the accompanying drawings. In the following description of the present invention, details of known functions and configuration are omitted for clarity of presentation.

Figure 5:
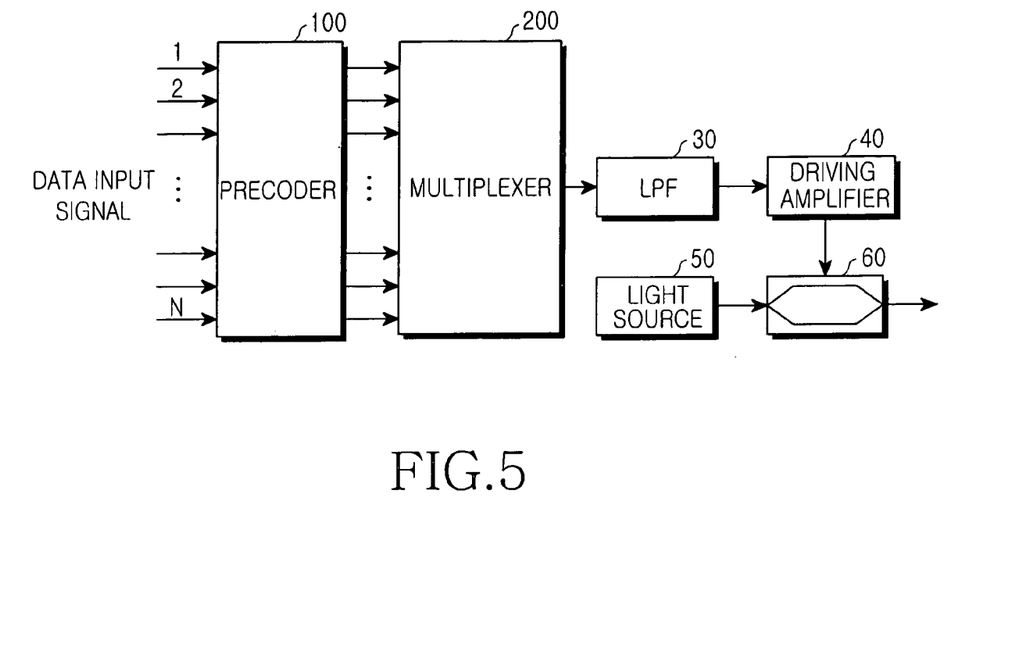
FIG. 5 is a block diagram showing a construction of an optical duo-binary transmission apparatus according to an embodiment of the present invention.
Figure 6:
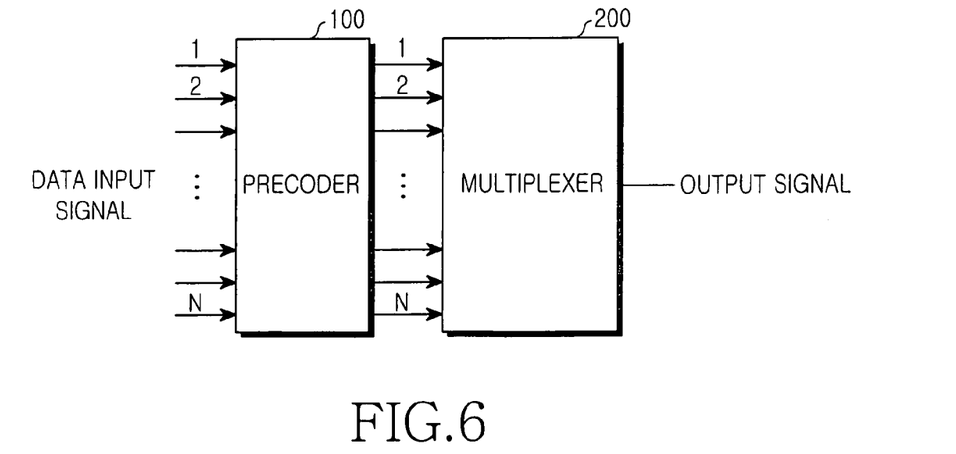
FIG. 6 is a view showing positions of a precoder and a multiplexer in the construction in FIG. 5.

FIG. 5 is a block diagram showing a construction of an optical duo-binary transmission apparatus according to an embodiment of the present invention, and FIG. 6 is a view showing positions of a precoder and a multiplexer in the construction in FIG. 5.

In FIG. 5, the optical duo-binary transmission apparatus according to the present invention includes a precoder 100, a multiplexer 200, a low-pass filter 30, a modulator driving amplifier 40, a light source 50, and an optical intensity modulator 60. The precoder 100 codes N number of data input signals, and the multiplexer 200 multiplexes the coded signals so as to output the multiplexed signal.

The precoder 100 is located in front of the multiplexer 200 as shown in FIG. 6, and codes the N data input signals in parallel.

Figure 7:
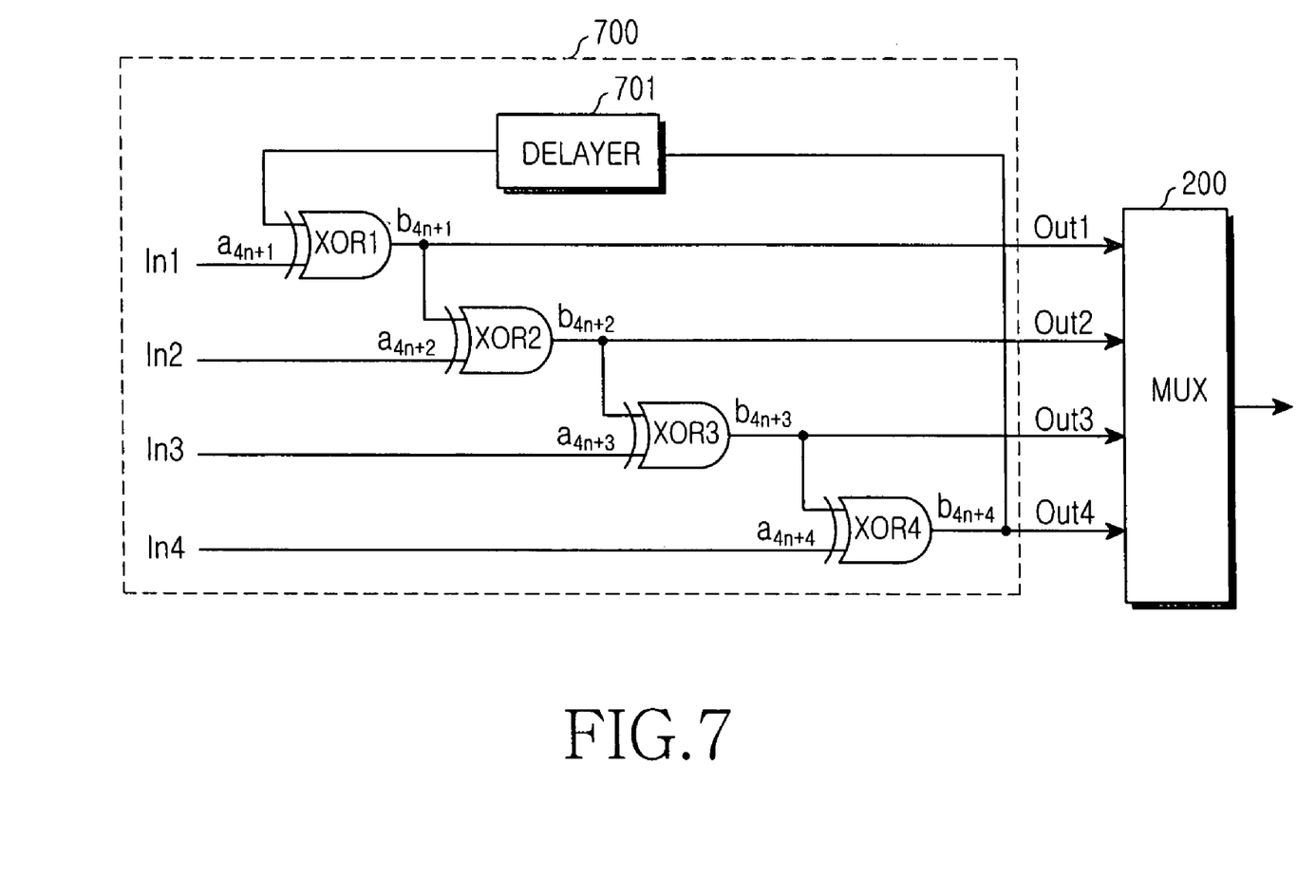
FIG. 7 is a view showing a construction of a precoder performing parallel processing according to a first embodiment of the present invention.

FIG. 7 is a view showing, by way of illustrative but non-limitative example, a construction of a precoder 700 performing parallel processing according to a first embodiment of the present invention, representing a case in which the number of channels (i.e. In1, In2, In3, and In4) of input signals to be multiplexed is 4. Referring to FIG. 7, the precoder 700 includes four XOR gates XOR1, XOR2, XOR3, and XOR4 and one data bit delayer 701 when the number of channels of input signals is 4.

When input signals are $a_{4n+1}$, $a_{4n+2}$, $a_{4n+3}$, and $a_{4n+4}$, a signal '$b_{4n+1}$' can be obtained by XORing the signal '$a_{4n+1}$' and a signal, which is achieved by time-delaying the signal '$b_{4n+4}$' by 1 data bit. A signal '$b_{4n+2}$' can be obtained by XORing the signal '$b_{4n+1}$' and signal '$a_{4n+2}$'. Signals '$b_{4n+3}$' and '$b_{4n+4}$' can be obtained in the same manner as described above. That is, the following logical operations are performed.

$$b_{4n+1}=a_{4n+1}\oplus b_{4(n-1)+4}=a_{4n+1}\oplus b_{4n}$$

$$b_{4n+2}=a_{4n+2}\oplus(a_{4n+1}\oplus b_{4n})=a_{4n+2}\oplus b_{4n+1}$$

$$b_{4n+3}=a_{4n+3}\oplus(a_{4n+2}\oplus(a_{4n+1}\oplus b_{4n}))=a_{4n+3}\oplus b_{4n+2}$$

$$b_{4n+4}=a_{4n+4}\oplus(a_{4n+3}\oplus(a_{4n+2}\oplus(a_{4n+1}\oplus b_{4n})))=a_{4n+4}\oplus b_{4n+3}$$

In FIG. 7, a d-flipflop (D-FF) can be used for delaying time by 1 data bit, and another XOR gate can be inserted into a path in which an XOR gate is not used for compensating for time delay at the XOR gate. In this case, the time delay can be compensated for without variation of the signal by inputting a "0" level signal to one input of the XOR gate.

Figure 8:
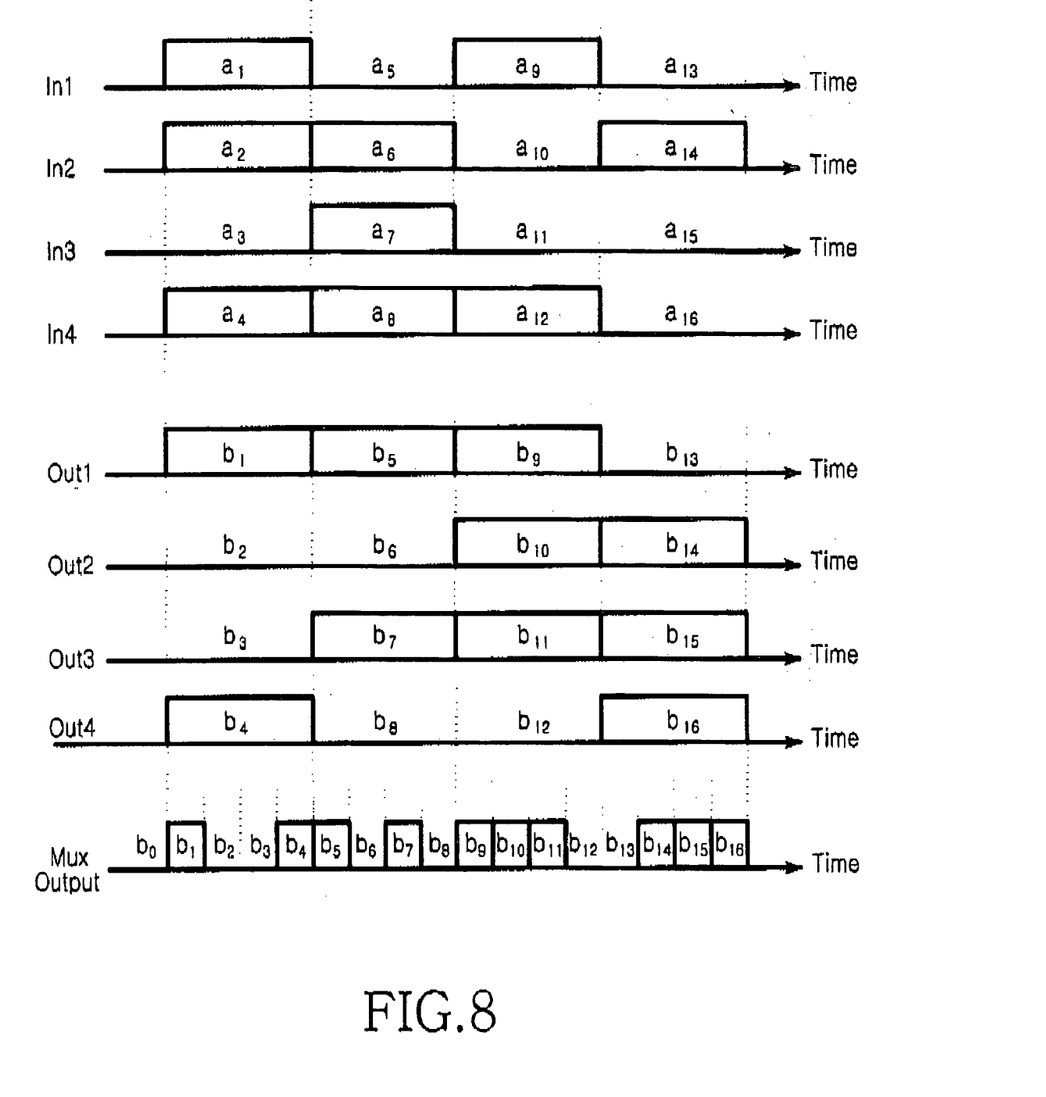
FIG. 8 is a view showing an example of input/output signals in FIG. 7.

FIG. 8 is a view showing input/output signals in FIG. 7 when an input signal is '1101011110010100'. In FIG. 8, if the input signals In1 to In4 are time-multiplexed, the multiplexed signal is equal to the input signal in FIG. 4. If the signals Out1 and Out4 obtained through the parallel processing are respectively time-multiplexed, the multiplexed signals are equal to the output signal in FIG. 4. That is, coding is performed in the same manner as that of the prior art (see FIG. 7).

The precoder 700 according to the first embodiment can be easily realized. However, as the number 'N' of the input signals increases, the time delay occurring at the XOR gate is accumulated. Therefore, time delay longer than 1 data bit may occur. Accordingly, the first embodiment is more effective when the number of the input signals is small.

The limitation in the number of the input signals stems from the existence of a feedback from the last XOR gate. By eliminating the feedback, the number of the input signals is not limited. Since a number of inputs are simultaneously processed, an added benefit is that a desired signal can be generated even by means of a low-speed element.

Figure 9:
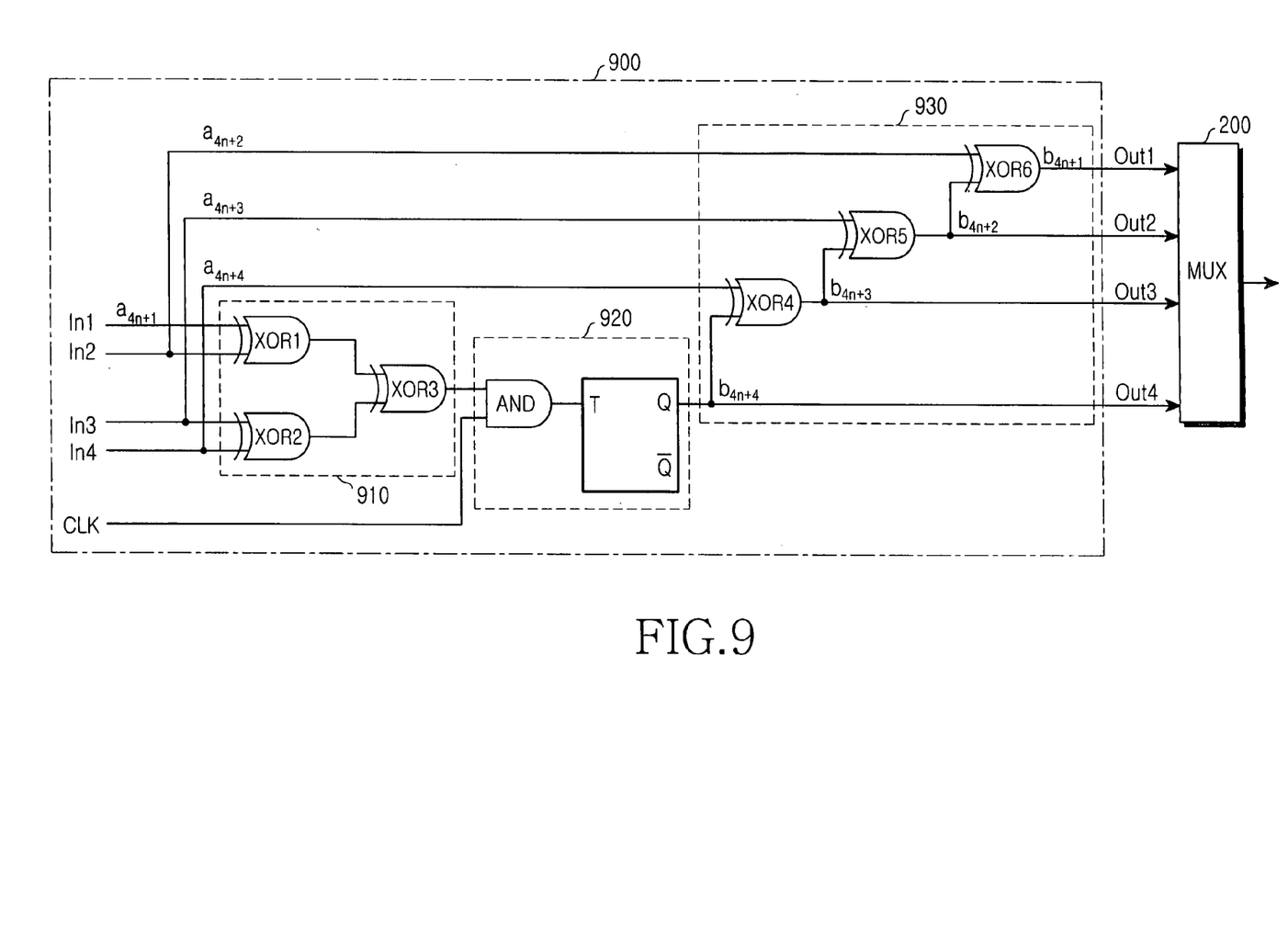
FIG. 9 is a view showing a construction of a precoder performing parallel processing according to a second embodiment of the present invention.
Figure 10:
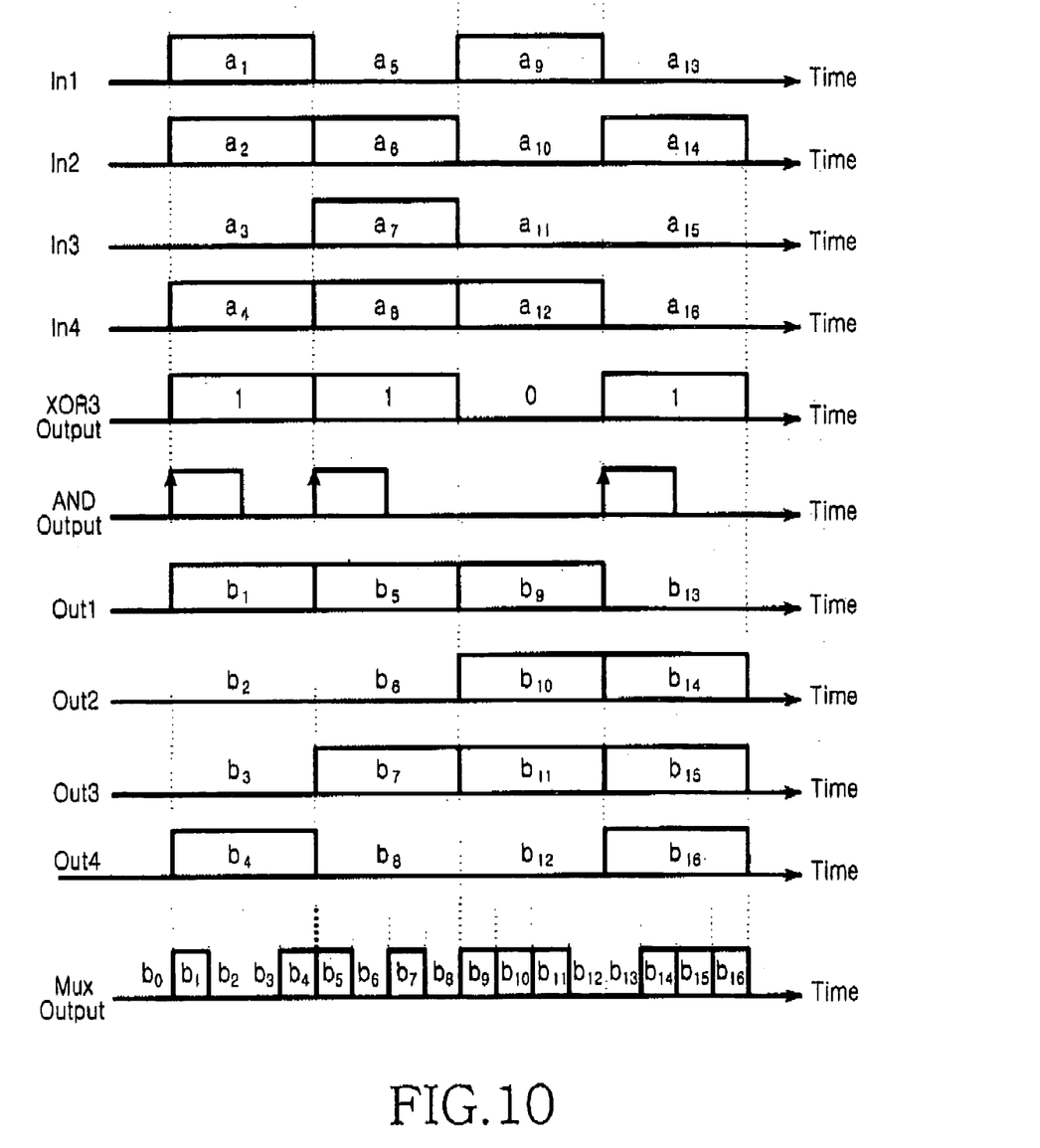
FIG. 10 is a view showing an example of input/output signals in FIG. 9.

FIG. 9 is a view showing an exemplary construction of a precoder 900 performing parallel processing according to a second embodiment of the present invention, and FIG. 10 is a view showing an example of the input/output signals in FIG. 9.

According to the second embodiment, a feed-forward method is used, so that the number of input signals is not limited. For simplicity of demonstration, an example in which the number N of input signals is 4 will be described below.

The precoder 900 shown in FIG. 9 includes a judgment unit 910, a toggle unit 920, an output unit 930, and a clock signal CLK.

Referring to FIGS. 9 and 10, the judgment unit 910 judges whether an odd number or even number of '0's exists in N number of input signals inputted at an $n^{th}$ time of signal input. For instance, in the case in which the number N of the input signals is even, the judgment unit 910 outputs '0' when the total number of '1's in the N number of input signals is even. On the other hand, the judgment unit 910 outputs '1' when the total number of '1's in the N number of input signals is odd. FIG. 10 shows an example of the signals as described above. The judgment unit 910 has a construction in which XOR gates are mutually connected in a pyramid configuration. If the number of the input signals increases, the number of the XOR gates also increases. When the number N of the input signals is 4, the judgment unit 910 includes three XOR gates, herein labeled XOR1, XOR2, and XOR3.

When an output signal of the judgment unit 910 is '1' (i.e. when the number of '1's in the input signals is odd), the toggle unit 920 toggles an output signal of the judgment unit 910. The toggle unit 920 includes an AND gate AND1 and a toggle flip-flop (hereinafter, referred to as a T-FF) and ANDs the output signal of the judgment unit 910 and the clock signal CLK. Further, the toggle unit 920 enables the ANDed signal to pass through the T-FF, while generating the $n^{th}$ output signal $b_{4n+4}$ (i.e. Out4). Then, the signal obtained by ANDing the output signal of the judgment unit 910 and the clock signal CLK is inputted to the T-FF, and a toggle of the signal output by the AND occurs at each rising edge (marked by an arrow in FIG. 10) of the AND output.

The output unit 930, which includes several XOR gates (i.e. XOR4, XOR5, and XOR6) and inverters, determines output values of other channels according to input signals $a_n$ on the basis of the $n^{th}$ output signal $b_{4n+4}$ from among N number of channels.

When output signals Out1 to Out4 obtained through the above-mentioned steps are time-multiplexed through the multiplexer 200, an output signal (i.e. Mux Output) as shown in FIG. 10 is obtained. Notably, this output signal is identical to the precoder output signal in FIG. 4.

According to a precoder of the present embodiment, in order to compensate for time delay occurring when a signal passes through an XOR gate, another XOR gate in which '0' is applied to one input can be inserted into the precoder, similarly to the precoder of the first embodiment. In order to compensate for time delay at an AND gate, analogously another AND gate having one input to which '1' is inputted can be inserted into the precoder. Likewise, in order to compensate for time delay due to a T-FF, a D-FF can be used for compensating for the time delay.

According to a precoder of the present invention as described above, coding is performed in parallel before time-multiplexing. Bottlenecking due to high speed data is thereby avoided even if relatively, low-speed electrical elements are used. Accordingly, when an optical duo-binary transmission apparatus is achieved by means of a precoder according to the present invention, a high speed precoder is unnecessary.

Moreover, the number of input signals configured is not limited, since an alternative non-feedback design is available.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A precoder comprising:
    a judgment unit configured to judge whether an odd number or even number of '1's exists in data input signals of N channels inputted at an $n^{th}$ time of channel input;
    a toggle unit configured to toggle an output signal of the judgment unit when said number of '1's is judged by the judgment unit to be odd, said toggle unit determining an output value of a channel of the N channels; and
    communicatively connected to the toggle unit, an output unit configured to determine output values of other channels of the N channels according to respective ones of the data input signals.

2. The precoder as claimed in claim 1, wherein the judgment unit includes a plurality of exclusive OR gates connected to each other in a pyramid configuration, so that the judgment unit outputs to the toggle unit '0' when said number of '1's is judged by the judgment unit to be even, or '1' when said number of '1's is judged by the judgment unit to be odd.

3. The precoder as claimed in claim 2, wherein the output unit includes N−1 XOR gates configured to perform XOR operations sequentially, each operation having as an input a respective one of said input signals and having as a further input a signal representative of a respective one of the channel output values.

4. The precoder as claimed in claim 3, wherein the toggle unit comprises:
    an AND gate configured to ANDing said output signal of the judgment unit and a clock signal; and
    a T flip-flop (T-FF) configured to toggling an output signal of the AND gate at each rising edge of the output signal of the AND gate.

5. The precoder as claimed in claim 2, wherein the output unit includes N−1 XOR gates configured to perform XOR operations, each operation having as an input a respective one of said input signals and further having as an input a signal representative of a respective one of the channel output values.

6. The precoder as claimed in claim 5, wherein the toggle unit comprises:
    an AND gate configured to perform ANDing said output signal of the judgment unit and a clock signal; and
    a T flip-flop (T-FF) configured to toggle an output signal of the AND gate at each rising edge of the output signal of the AND gate.

7. The precoder as claimed in claim 2, wherein the toggle unit comprises:
    an AND gate configured to perform ANDing said output signal of the judgment unit and a clock signal; and
    a T flip-flop (T-FF) configured to toggle an output signal of the ANT) gate at each rising edge of the output signal of the AND gate.

8. The precoder as claimed in claim 1, wherein the toggle unit comprises:
    an AND gate configured to perform ANDing said output signal of the judgment unit and a clock signal; and
    a T flip-flop (T-FF) configured to toggle an output signal of the AND gate at each rising edge of the output signal of the AND gate.

9. The precoder as claimed in claim 1, wherein the output unit includes N−1 XOR gates configured to perform XOR operations sequentially, each operation having that has as an input a respective one of said input signals and that has as a further input a signal representative of a respective one of the channel output values.

10. The precoder as claimed in claim 9, wherein the toggle unit comprises:
   an AND gate configured to perform ANDing said output signal of the judgment unit and a clock signal; and
   a T flip-flop (T-FF) configured to toggle an output signal of the AND gate at each rising edge of the output signal of the AND gate.

11. The precoder as claimed in claim 1, wherein the output unit includes N−1 XOR gates configured to perform XOR operations, each operation having as an input a respective one of said input signals and further having as an input a signal representative of a respective one of the channel output values.

12. The precoder as claimed in claim 11, wherein the toggle unit comprises:
   an AND gate configured to perform ANDing said output signal of the judgment unit and a clock signal; and
   a T flip-flop (T-FF) configured to toggle an output signal of the AND gate at each rising edge of the output signal of the AND gate.

13. An optical duo-binary transmission apparatus comprising:
   a precoder configured to code in parallel data input signals of N channels, wherein the precoder includes a judgment unit for judging whether an odd number or even number of '1's exist in data input signals of N channels inputted at an $n^{th}$ time of channel input; and
   a multiplexer configured to time division multiplex the signals coded by the precoder.

14. The optical duo-binary transmission apparatus as claimed in claim 13, wherein the precoder further comprises:
   a toggle unit for toggling an output signal of the judgment unit when said number of '1's is judged by the judgment unit to be odd, said toggling determining an output value of a channel of the N channels; and
   communicatively connected to the toggle unit, an output unit for determining output values of other channels of the N channels according to respective ones of the data input signals.

15. The optical duo-binary transmission apparatus as claimed in claim 13, wherein the precoder further comprises a unit to which the data input signals serve as input, said unit being comprised of m stages of XOR gates wherein $N=2^m$.

16. The optical duo-binary transmission apparatus as claimed in claim 15, wherein the precoder further comprises an output unit having N−1 stages of XOR gates.

17. The optical duo-binary transmission apparatus as claimed in claim 16, wherein the units comprised on m stages are joined to the output unit by an AND gate feeding a T flip-flop (T-FF).

* * * * *